(12) United States Patent
Wright et al.

(10) Patent No.: US 9,020,005 B2
(45) Date of Patent: Apr. 28, 2015

(54) MULTICOLOR PHOTONIC CRYSTAL LASER ARRAY

(71) Applicant: Sandia Corporation, Albuquerque, NM (US)

(72) Inventors: Jeremy B. Wright, Albuquerque, NM (US); Igal Brener, Albuquerque, NM (US); Ganapathi S. Subramania, Albuquerque, NM (US); George T. Wang, Albuquerque, NM (US); Qiming Li, Shanghai (CN)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 14/171,231

(22) Filed: Feb. 3, 2014

(65) Prior Publication Data

US 2014/0219306 A1 Aug. 7, 2014

Related U.S. Application Data

(60) Provisional application No. 61/760,418, filed on Feb. 4, 2013.

(51) Int. Cl.
| | |
|---|---|
| H01S 5/00 | (2006.01) |
| H01S 5/187 | (2006.01) |
| H01S 5/18 | (2006.01) |
| H01S 5/183 | (2006.01) |
| H01S 5/10 | (2006.01) |
| H01S 5/12 | (2006.01) |
| H01S 5/34 | (2006.01) |
| H01S 5/343 | (2006.01) |
| H01S 5/42 | (2006.01) |

(52) U.S. Cl.
CPC . *H01S 5/187* (2013.01); *H01S 5/18* (2013.01); *H01S 5/18319* (2013.01); *H01S 5/10* (2013.01); *H01S 5/105* (2013.01); *H01S 5/1228* (2013.01); *H01S 5/341* (2013.01); *H01S 5/3428* (2013.01); *H01S 5/34333* (2013.01); *H01S 5/42* (2013.01)

(58) Field of Classification Search
CPC ....... H01S 5/105; H01S 5/10; H01S 5/18319; H01S 5/18
USPC ................ 372/45.012, 44.01, 43.01, 50.124, 372/50.12, 50.1
See application file for complete search history.

(56) References Cited

U.S. PATENT DOCUMENTS

2006/0245464 A1* 11/2006 Hori et al. ........................ 372/99
2014/0286367 A1* 9/2014 Scofield et al. ............. 372/43.01

OTHER PUBLICATIONS

Matsubara, Hideki et al., "GaN Photonic-Crystal Surface-Emitting Laser at Blue-Violet Wavelengths", Science, vol. 319, pp. 445-447, 2008.

(Continued)

*Primary Examiner* — Kinam Park
(74) *Attorney, Agent, or Firm* — Kevin W. Bieg

(57) ABSTRACT

A multicolor photonic crystal laser array comprises pixels of monolithically grown gain sections each with a different emission center wavelength. As an example, two-dimensional surface-emitting photonic crystal lasers comprising broad gain-bandwidth III-nitride multiple quantum well axial heterostructures were fabricated using a novel top-down nanowire fabrication method. Single-mode lasing was obtained in the blue-violet spectral region with 60 nm of tuning (or 16% of the nominal center wavelength) that was determined purely by the photonic crystal geometry. This approach can be extended to cover the entire visible spectrum.

20 Claims, 9 Drawing Sheets

(56) References Cited

OTHER PUBLICATIONS

Ishizawa, Shusuke et al., "Optically Pumped Green (530-560 nm) Stimulated Emissions from InGaN/GaN Multiple-Quantum-Well Triangular-Lattice Nanocolumn Arrays", Applied Physics Express, vol. 4, pp. 055001-1-055001-3, 2011.

Scofield, Adam C. et al., "Bottom-up Photonic Crystal Lasers", Nano Letters, vol. 11, pp. 5387-5390, 2011.

Kouno, Tetsuya et al., "Two-dimensional light confinement in periodic InGaN/GaN nanocolumn arrays and optically pumped blue stimulated emission", Optics Express, vol. 17, No. 22, pp. 20440-20447, 2009.

Kouno, Tetsuya et al., "Stimulated emission on two-dimensional distributed feedback scheme in triangular GaN nanocolumn arrays", Electronics Letters, vol. 46, No. 9, pp. 644-645, 2010.

Painter, O. et al., "Two-Dimensional Photonic Band-Gap Defect Mode Laser", Science, vol. 284, pp. 1819-1821, 1999.

Park, Hong-Gyu et al., "Electrically Driven Single-Cell Photonic Crystal Laser", Science, vol. 305, pp. 1444-1447, 2004.

Chang, Li-Ming et al., "Laser emission from GaN photonic crystals", Applied Physics Letters, vol. 89, pp. 071116-1-071116-3, 2006.

Kim, Dong-Uk et al., "Free-Standing GaN-Based Photonic Crystal Band-Edge Laser", IEEE Photonics Technology Letters, vol. 23, No. 20, pp. 1454-1456, 2011.

Monat, C. et al., "InP-based two-dimensional photonic crystal on silicon: In-plane Bloch mode laser", Applied Physics Letters, vol. 81, No. 27, pp. 5102-5104, 2002.

Ferrier, L. et al., "Surface emitting microlaser based on 2D photonic crystal rod lattices," Optics Express, vol. 17, No. 12, pp. 9780-9788, 2009.

Ferrier, L. et al., "Slow Bloch mode confinement in 2D photonic crystals for surface operating devices", Optics Express, 2008, vol. 16, No. 5, pp. 3136-3145.

Li, Qiming, et al., "Single-mode GaN nanowire lasers", Optics Express, 2012, vol. 20, No. 16, pp. 17873-17879.

Li, Qiming, et al., "Optical performance of top-down fabricated InGaN/GaN nanorod light emitting diode arrays", Optics Express, 2011, vol. 19, No. 25, pp. 25528-25534.

Wang, George T. et al., U.S. Appl. No. 13/743,433, filed Jan. 17, 2013, entitled "Method of Fabricating Vertically Aligned Group III-V Nanowires".

* cited by examiner

MULTICOLOR PHOTONIC CRYSTAL LASER ARRAY

CROSS-REFERENCE TO RELATED APPLICATION

This application claims the benefit of U.S. Provisional Application No. 61/760,418, filed Feb. 4, 2013, which is incorporated herein by reference.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to vertically emitting laser arrays and, in particular, to a multicolor photonic crystal laser array that can be used for lighting and displays.

BACKGROUND OF THE INVENTION

Surface-emitting photonic crystal (PC) lasers are promising light sources for the next-generation of compact and efficient light emitters used in data storage, biomedical applications, solid-state lighting and display technologies. See M. Ikeda and S. Uchida, *physica status solidi (a)* 194, 407 (2002); H. M. Shapiro, *Practical Flow Cytometry*, 4th ed., John Wiley & Sons, Inc. (2003); T. Gabrecht et al., *Photochemistry and Photobiology* 83, 450 (2007); A. Neumann et al., *Opt. Express* 19, A982 (2011); and D. Sizov et al., *J. Lightwave Technol.* 30, 679 (2012). However, in order for these PC lasers to be of practical use, they must be constructed to emit over a large wavelength range, particularly in the violet to visible wavelength regime. Previous realizations of PC lasers required complicated fabrication schemes, had limited tuning range, were reported at longer wavelengths far from the blue-violet regime, or implemented a single gain section. See H. Matsubara et al., *Science* 319, 445 (2008); S. Ishizawa et al., *Appl. Phys. Express* 4, (2011); A. C. Scofield et al., *Nano Lett.* 11, 5387 (2011); T. Kouno et al., *Opt. Express* 17, 20440 (2009); T. Kouno et al., *Electron. Lett.* 46, 644 (2010); O. Painter et al., *Science* 284, 1819 (1999); H. G. Park et al., *Science* 305, 1444 (2004); L.-M. Chang et al., *Applied Physics Letters* 89, 071116 (2006); and D. Kim et al., *IEEE Photonics Technol. Lett.* 23, 1454 (2011). In particular, emerging applications such as solid-state lighting and display technologies require micro-scale vertically emitting lasers with controllable distinct lasing wavelengths and broad wavelength tunability arranged in desired geometrical patterns to form "super-pixels". Conventional edge-emitting lasers and current surface-emitting lasers that require abrupt changes in semiconductor bandgaps or cavity length are not a viable solution for this requirement.

Therefore, a need remains for a vertically emitting PC laser array that can be tuned over a large wavelength range.

SUMMARY OF THE INVENTION

The present invention is directed to a surface-emitting photonic crystal laser, comprising a two-dimensional photonic crystal having a periodic vertically emitting laser nanowire structure and wherein the gain of an active region of the laser nanowire structure is sufficiently inhomogeneously broadened to emit at a lasing wavelength within a spectral bandwidth determined by the lattice structure, lattice constant, and nanowire diameter and height of the two-dimensional photonic crystal. The laser nanowire structure comprises at least one additional active region that emits at another lasing wavelength with the spectral bandwidth of the photonic crystal. The nanowires can comprise an axial active region or a radial active region. The vertically emitting laser nanowire structures can comprise a group III-V heterostructure and, more preferably, a group III-nitride heterostructure. The lasing wavelength can be between 200 and 650 nm. The periodic vertically emitting laser nanowire structure can comprise at least 5 lattice periods, thereby providing a first laser pixel that emits at a first lasing wavelength. Additional laser pixels can be provided that emit at different lasing wavelengths depending on the parameters of the two-dimensional photonic crystals of additional laser pixels, thereby providing a multicolor photonic crystal laser array. By selectively exciting certain laser pixels, each with a different emission wavelength, different colours and warmths can be achieved for a breadth of applications.

As an example of the invention, a surface emitting, single-mode 2DPC optically pumped laser emitting in the blue-violet spectral region was demonstrated to have a remarkable 60 nm of tuning (or 16% of the nominal centre wavelength), determined purely by the photonic crystal geometry. This wide tuning in emission wavelength was achieved by employing two gain sections (GaN/InGaN MQWs and InGaN underlayer) covering different wavelength bands with broad gain bandwidth in conjunction with careful 2DPC design to select the lasing wavelength. Electron beam lithography was utilized to pattern the InGaN/GaN nanowire hexagonal lattice based 2DPC combined with a novel top-down nanofabrication method. The exquisite control enabled by the two-step, top-down etch process enables excellent quality nanowire arrays with controlled geometries and very high yield. Normal direction lasing emission, with relatively low thresholds, was achieved by using the slow group velocity modes near the Γ point of the 2DPCs at higher bands. This approach can be used to include additional gain sections in order to cover the entire visible spectrum. The fabrication approach can also be appropriately modified to utilize doped structures to create electrically injected devices. The invention enables solid-state lighting devices and displays fabricated using III-nitride 2DPC nanowire lasers to have dynamic colour tuning over a larger colour gamut.

BRIEF DESCRIPTION OF THE DRAWINGS

The detailed description will refer to the following drawings, wherein like elements are referred to by like numbers.

DETAILED DESCRIPTION OF THE INVENTION

Sufficiently broadened gain spectra are necessary in order to fabricate an array of lasers that span a large spectral bandwidth. One way of obtaining a broad enough gain spectrum is by choosing an active material with gain that is sufficiently inhomogeneously broadened. However, these broadened gain spectra are often viewed as detrimental due to the reduced peak gain, resulting in an increase of the laser threshold. The rich dispersion characteristics of photonic crystals (PCs) provide an elegant solution to this problem. Photonic crystals are composed of periodic dielectric nanostructures that affect the propagation of electromagnetic waves by defining allowed and forbidden optical bands. Therefore, PCs contain regularly repeating regions of high and low dielectric constant. The periodicity of the photonic crystal structure is less than the wavelength of the electromagnetic waves that are to be diffracted.

Photonic crystal lasers comprise active gain region nanostructures that provide the mode confinement and the density of optical states structure required for optical feedback to take place. By adjusting the parameters (e.g., lattice structure, lattice constant or pitch, nanostructure diameter and height, etc.) of a two-dimensional photonic crystal (2DPC) it is possible to maintain a low threshold gain condition for a 2DPC-based laser over a large wavelength tuning range. The key to obtaining a low lasing threshold lies in the bandstructure of the 2DPC. It has been predicted that in 2D and 3D photonic crystals certain modes can exhibit near-zero group velocity along certain lattice directions for particular bands that can be utilized to reduce lasing threshold. See H. Matsubara et al., Science 319, 445 (2008); K. Sakoda, *Optical Properties of Photonic Crystals*, 2nd ed., Springer-Verlag (2005); C. Monat et al., Applied Physics Letters 81, 5102 (2002); L. Ferrier et al., Opt. Express 17, 9780 (2009); and L. Ferrier et al., Opt. Express 16, 3136 (2008). These modes propagate slowly enabling increased interaction time of the electromagnetic fields with the gain material thereby lowering the lasing threshold. This makes it possible to reach low lasing thresholds in material systems that exhibit a small amount of gain or a reduced gain over a larger bandwidth.

Figure 1:
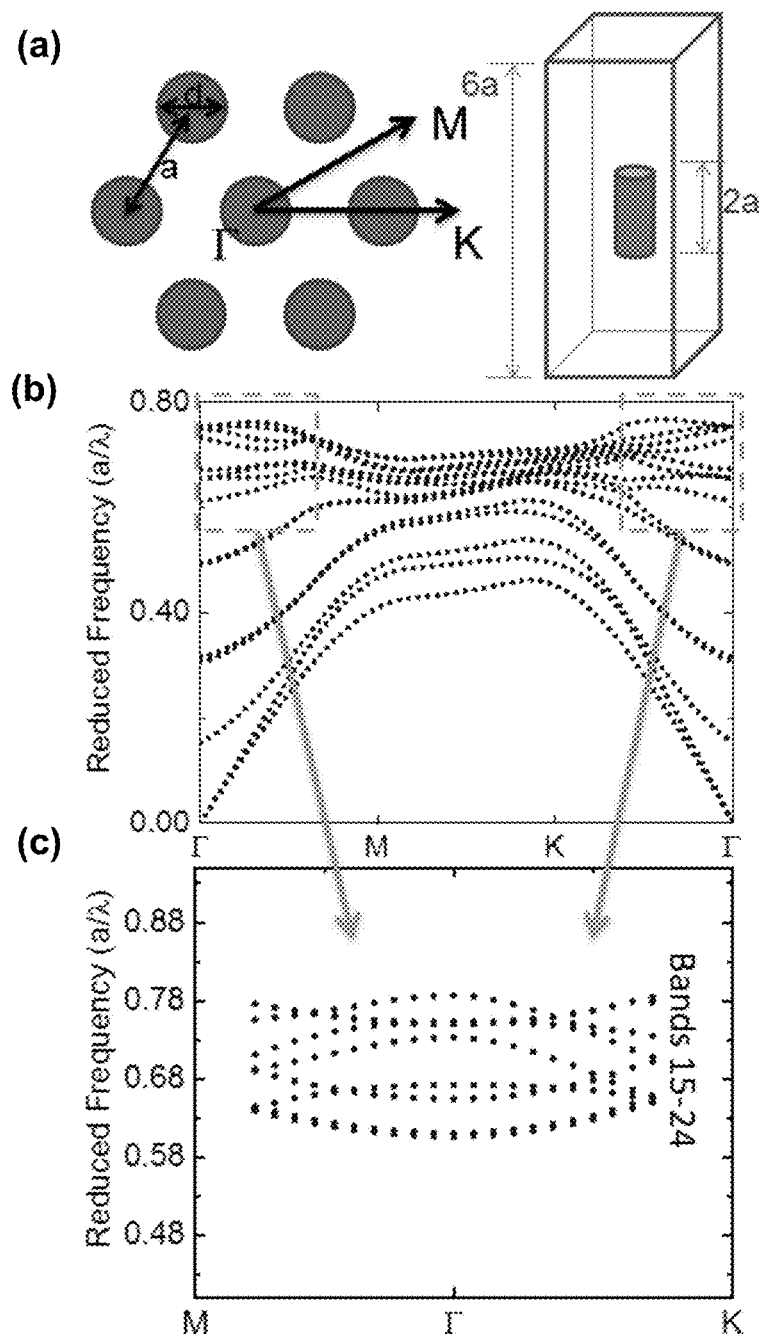
FIG. 1(a) is a schematic illustration of a simulated photonic crystal lattice illustrating the lattice constant 'a', the nanowire diameter 'd', and the reciprocal lattice vectors.
FIG. 1(b) shows the photonic bandstructure calculated using a plane-wave expansion method for a hexagonal lattice of GaN nanowires with a diameter 'd=0.4a' and height 'h=2a'.
FIG. 1(c) shows the bandstructure of bands 15-23 near the gamma point.

FIG. 1(a) is a schematic illustration of a simulated photonic crystal lattice illustrating the lattice constant 'a', the nanowire diameter 'd', and the reciprocal lattice vectors. The height of the wire is h=2a with a simulation supercell height of 6a in the vertical direction to account for the finite height of the wires. FIG. 1(b) shows the band structure calculated using a plane-wave expansion method for a hexagonal lattice of GaN nanowires with a diameter d=0.4a. While lower band indices show large dispersion, higher band indices have much less dispersion with relatively flat bands. FIG. 1(c) shows a detailed inspection of bands 15-24 near the Γ point. The exemplary 2DPC design targets the higher bands (n>16) with low group velocities and are outside of the light cone so the electromagnetic fields are expected to extend above the GaN nanowire array. Nevertheless, these fields still interact with the gain media. Utilization of the higher bands also has an added advantage of relaxing the lattice constant and nanowire dimension requirements thus easing nanofabrication constraints. For certain bands (20-23), the low dispersion, slow group velocity modes are close to the Γ point, making normal emission possible. The small but non-zero in-plane component of the wavevector of these modes enables efficient interaction with the gain regions while the larger out-of-plane wavevector directs the lasing emission to occur preferentially in the normal direction.

The present invention is directed to a 2DPC-based laser comprising a periodic array of nanowires that emits in an important region of the electromagnetic spectrum. The invention is generally useful with any vertically aligned group III-V nanowire array. The 2DPC can generally have a lattice constant that is 0.7-0.8 times the lasing wavelength and a nanowire diameter that is 0.3 to 0.5 times the lattice constant. The nanowires can have a variety of cross sections depending on the etch chemistry, including circular. The term nanowire can be used interchangeably with the terms nanocolumn, nanopillar, or nanorod, or variations thereof. In additional to the hexagonal PC lattice structure, other lattice structures that have slow group velocity modes with different frequency, polarization, and spatial distributions to tailor the laser far-field pattern can be used, including square, rectangular, honeycomb, Archimedean, etc. The III-V compound semiconductor can comprise one or more group III element, such as aluminum, gallium, or indium, and one or more group V element, such as antimony, arsenic, phosphorous, or nitrogen. For example, the 2DPC laser can be a GaN-based laser with a lasing wavelength less than about 650 nm, as described in further detail in the examples below. However, the invention can be generalized to other III-V semiconductors, with an expanded range of lasing wavelengths, by modifying the nanowire fabrication etch chemistries and active region heterostructures. For example, an III-nitride heterostructure can comprise at least two of GaN, AlN, InN, AlGaN, InGaN, InAlN, and AlInGaN, and have a lasing wavelength between 200 and 1800 nm.

The 2DPC-based laser can meet all of the requirements for next-generation laser arrays: i) the fabrication is scalable leading to tunability over a large wavelength range that can be performed, at once, on a single substrate; ii) the necessary area of the photonic crystal is small, allowing for dense arrays; iii) the fabrication for nanowire structures is simplified since there is no need to remove the substrate or fabricate a distributed Bragg reflector (DBR) beneath the PC; iv) light is emitted vertically; and v) the emission is single-mode. These requirements can be met using a design based upon low group velocity lasing that utilizes lateral feedback which allows the incorporation of additional gain materials intended for different spectral regions. See K. Sakoda, *Optical Properties of Photonic Crystals*, 2$^{nd}$ ed., Springer-Verlag (2005). This fabrication method coupled with the wide gain bandwidth of semiconductor nitride materials enables a new class of compact, monolithic multiple-wavelength photonic devices.

As an example of the present invention, a 2DPC-based laser comprising an array of GaN nanowires in a hexagonal lattice was fabricated to achieve lasing in a broad gain bandwidth system. The nanowires contained two gain sections embedded axially—one was composed of InGaN multiple quantum wells (MQWs) with an emission centered at 430 nm, the other a 150 nm thick InGaN underlayer, with an emission centered at 385 nm, commonly used to improve the quality of the subsequent MQW structures. Selective lasing of the different gain sections can be achieved by carefully designing the 2DPC parameters (e.g. lattice constant, nanowire diameter, height) to match the slow group velocity modes with the desired lasing wavelength.

Figure 2:
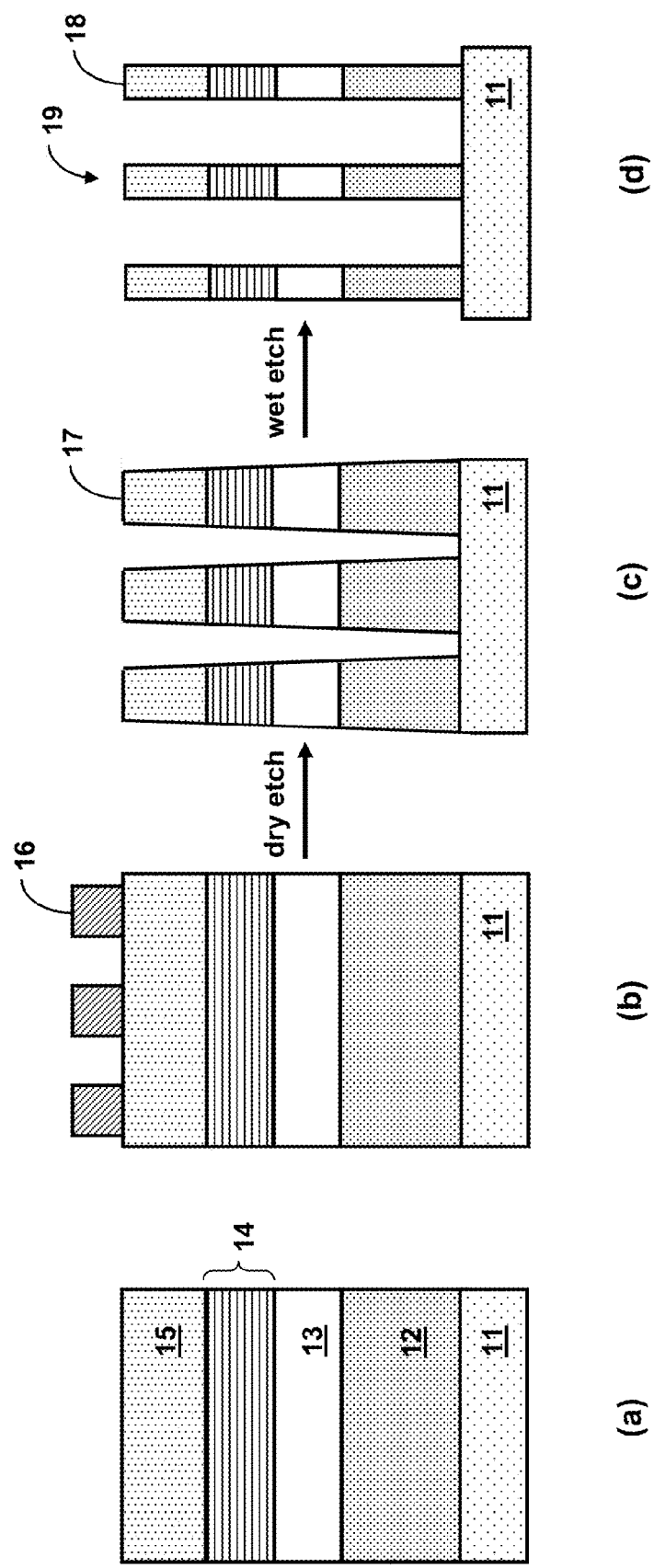
FIGS. 2(a)-(d) show a schematic illustration of a method to fabricate a photonic crystal laser comprising nanowires with an axial active region.

The 2DPC laser array was fabricated using a top-down nanowire fabrication method described previously. See Q. Li et al., *Opt. Express* 20, 17873 (2012); Q. Li et al., *Opt. Express* 19, 25528 (2011); and U.S. application Ser. No. 13/743,433, filed Jan. 17, 2013, which are incorporated herein by reference. The top-down approach enables the use of high quality planar epitaxial materials, thereby relaxing 1D material growth constraints. FIGS. 2(a)-(d) illustrate the two-step etch, top-down fabrication method of the exemplary 2DPC laser array. As shown in FIG. 2(a), the semiconductor material was grown on 2" c-plane sapphire 11 using a metal organic chemical vapor deposition (MOCVD) reactor. The epitaxial layers consisted of an n-i-n structure of GaN 15, an axial heterostructure active region comprising InGaN QWs 14, and an InGaN underlayer 13 grown on a 4-µm buffer layer of GaN 12. The 4-µm thick GaN buffer layer 12 discourages Fabry-Perot type oscillations in the vertical direction by eliminating the reflection from the nanowire-substrate interface. Since processing of the 2DPC laser requires stringent control over the array geometry, electron-beam lithography was used to pattern the photonic crystal arrays. As shown in FIG. 2(b), a nickel etch mask 16 was patterned using electron-beam lithography and fabricated by a lift-off process. To transfer the photonic crystal pattern to the underlying semiconductor material, the devices were etched using a reactive-ion dry-etch. The dry etch created isotropic nanocones 17, as shown in FIG. 2(c). The dry-etch step was followed by a KOH-based (AZ400K photoresist developer) wet-etch to remove the highly defective region caused by plasma damage. This wet-etch can be timed to precisely control the diameter of the resulting individual nanowires 18 and form a 2DPC array 19 of highly anisotropic nanowire structures due to the selective nature of the etch chemistry, as shown in FIG. 2(d). The top-down nanowire fabrication method can be used more generally to fabricate III-V nanowires with axial heterostructure active regions and, more particularly, III-nitride nanowire structures.

Figure 3:
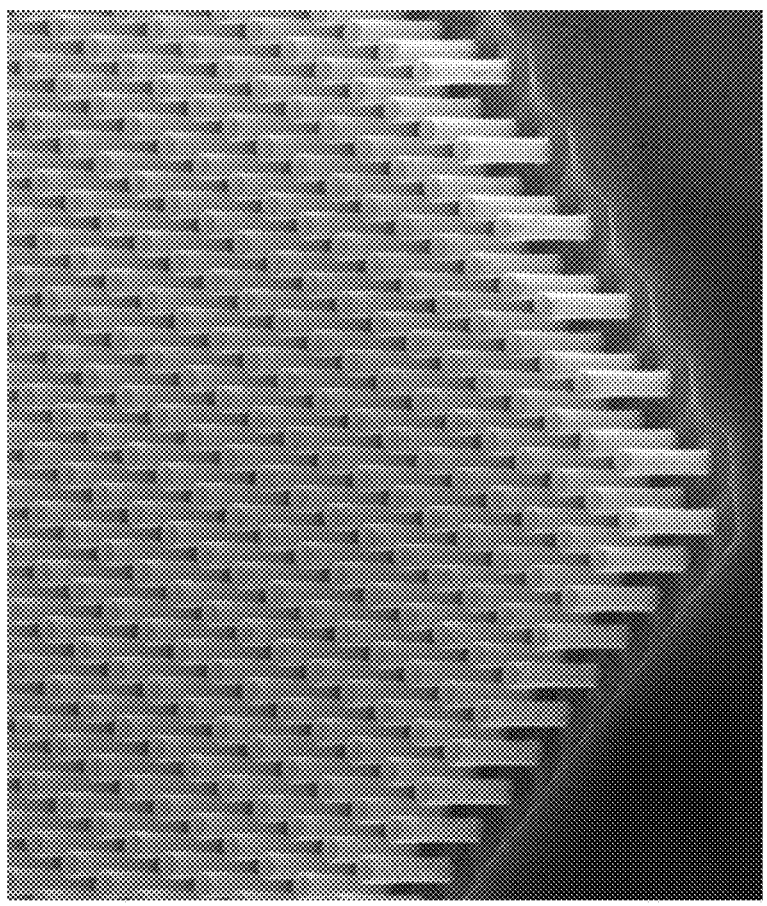
FIG. 3 is a scanning electron micrograph of a photonic crystal laser array fabricated according to the method shown in FIGS. 2(a)-(d).

FIG. 3 shows a scanning electron micrograph of a 2DPC laser array fabricated according to this method. The nanowires measured 600 nm tall and were packed in a hexagonal lattice. A slight taper of the nanowires can be seen due to the difference in the etch rate of the GaN and InGaN quantum wells.

Figure 4:
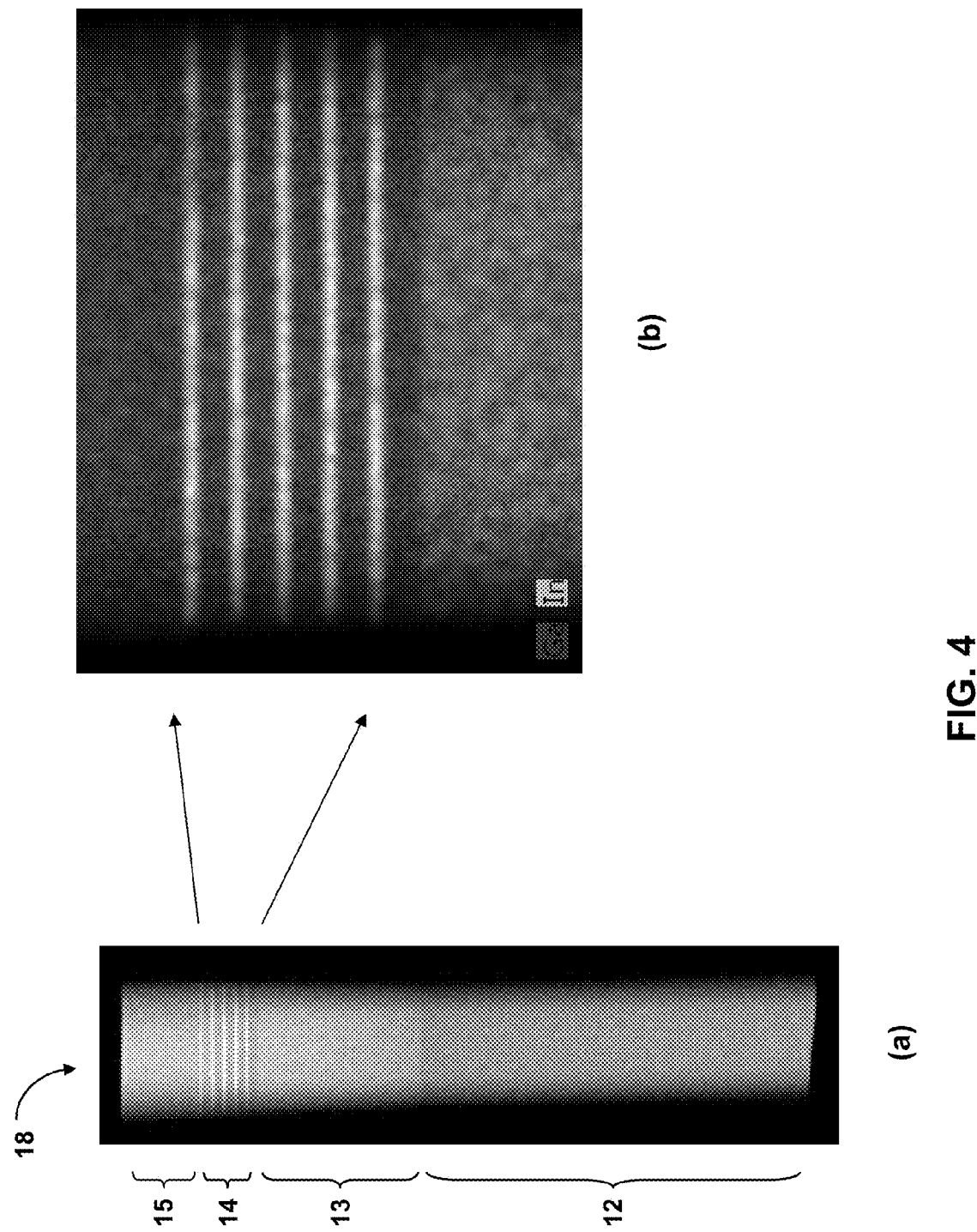
FIG. 4(a) is a high resolution transmission electron micrograph of a single nanowire from the array shown in FIG. 3.
FIG. 4(b) is a high-resolution energy dispersive x-ray spectroscopy (EDX) mapping under scanning TEM mode showing the indium and gallium distributions in the multiple quantum well structure.

FIG. 4(a) is a high resolution transmission electron micrograph of a single nanowire from the 2DPC shown in FIG. 3. A 2% indium underlayer 13 is visible beneath the InGaN/GaN quantum wells 14 on top of the 4 µm GaN buffer layer 12. FIG. 4(b) is a high-resolution energy dispersive x-ray spectroscopy (EDX) mapping under scanning TEM mode showing the five MQW InGaN/GaN structure comprising In-rich horizontal bands in a Ga-rich background. The two gain sections are easily distinguished with the 2% In underlayer visible beneath the InGaN quantum wells.

Figure 5:
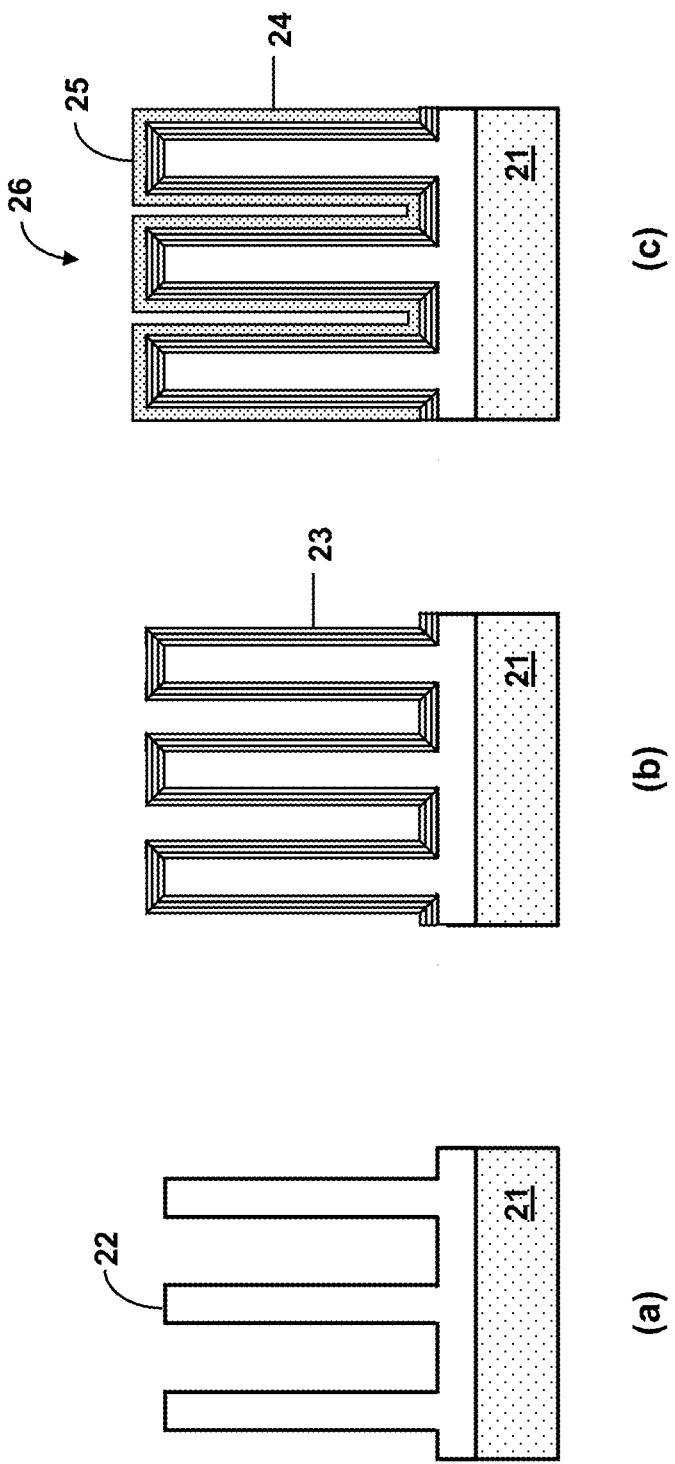
FIGS. 5(a)-(c) show a schematic illustration of a method to fabricate a photonic crystal laser comprising core-shell nanowires with a radial active region.

Alternatively, the 2DPC can comprise vertically aligned core-shell nanowires with a radial active region, fabricated according to a method described in U.S. application Ser. No. 13/743,433. First, an array of vertically aligned III-V compound semiconductor nanowires is fabricated by providing a III-V layer on a substrate; coating the III-V layer with an etch mask; plasma etching the III-V layer through the etch mask to provide a semi-periodic array of tapered nanowires; and selectively wet etching the sidewalls of the tapered nanowires to provide an array of vertically aligned III-V compound semiconductor nanowires 22 on the substrate 21, as shown in FIG. 5(a). As shown in FIG. 5(b), this method further comprises growing a radial heterostructure shell layer 23 coaxial with each of the vertically aligned III-V nanowires 22. The method can further comprise growing a top layer 24 on the shell layers 23 to provide a 2DPC array 26 of core-shell nanowire structures 25, as shown in FIG. 5(c). The III-V nanowires can preferably comprise III-nitride nanowires. For example, the III-nitride nanowires can comprise vertically aligned n-type GaN nanowires. The shell layer can comprise a radially grown III-nitride MQW structure, such as an InGaN/GaN- or GaN/AlGaN-based MQW structure. The top layer can comprise p-type InGaN. Alternatively, an inverted structure can comprise an array of vertically aligned p-type GaN nanowire cores surrounded by an III-nitride MQW shell layer and an n-type GaN top layer. Other III-nitride and III-V core-shell structures can also be used.

A test structure was fabricated according to the method shown in FIGS. 2(a)-(d) to examine the tuning available from varying the lattice constants and diameters of the nanowires in an array of photonic crystal pixels. To utilize the entire available gain bandwidth of the two gain regions of the axial active region, an array of 2DPC 'pixels' with lattice constants ranging from 290 nm to 330 nm was fabricated. For each lattice constant, the nanowire diameters ranged from d=0.43a–0.47a (i.e., ~120 nm to 150 nm). All of the nanowires had a uniform height of ~600 nm. The test structure was 100 µm×100 µm in size and comprised an array of 10 µm×10 µm pixels, each with a distinct lattice constant. The test structure was fabricated without a separation gap between photonic crystal pixels, to illustrate that a very large packing density can be achieved. Each pixel in the array could be addressed individually by pumping a selected area.

Figure 6:
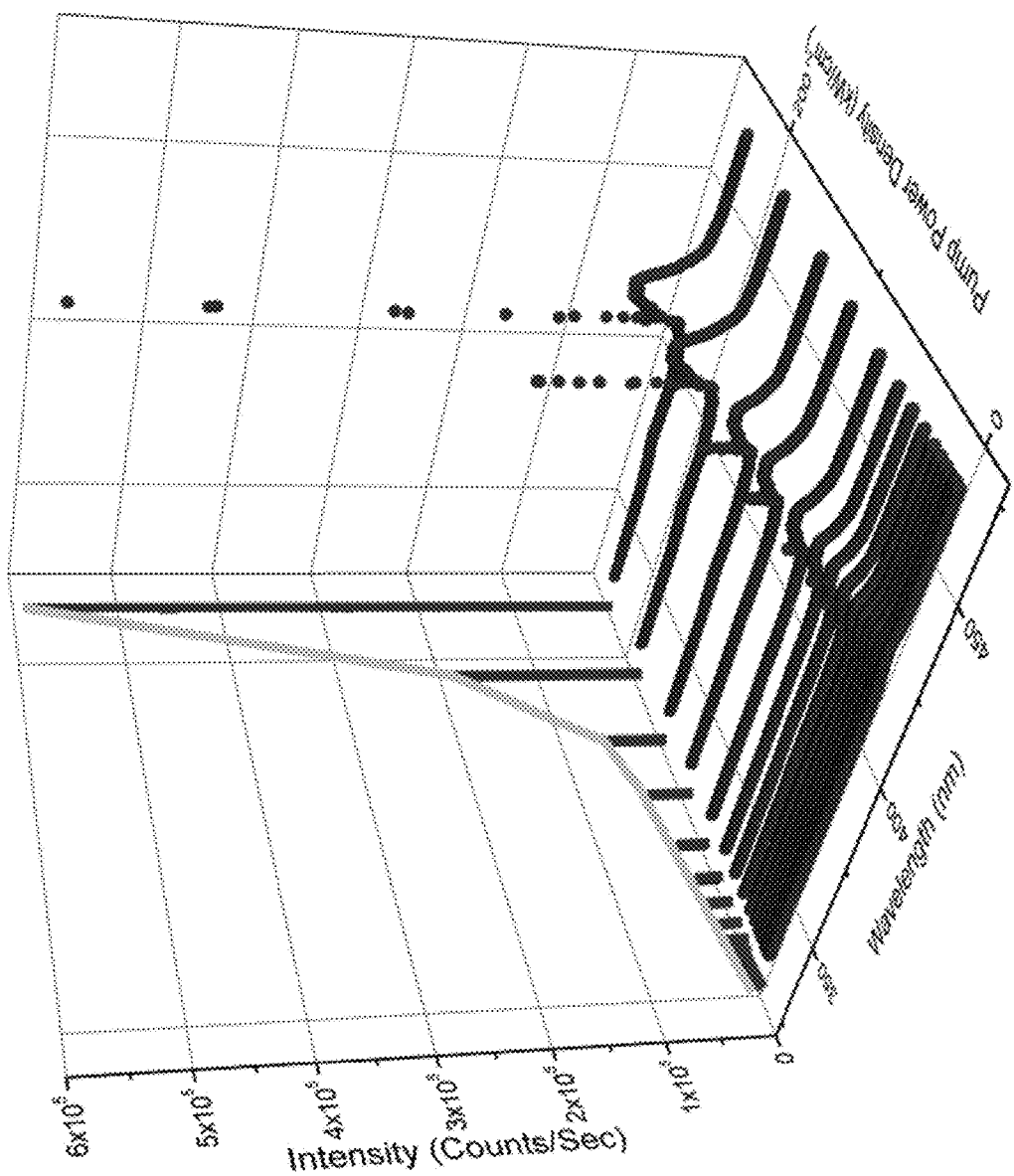
FIG. 6 is a graph of the spectral characterization of a representative photonic crystal laser having an axial active region. The light-in light-out curve was measured from an array having a nanowire diameter d=143 nm and lattice constant a=320 nm array. The spectra shown were measured between 5 kW/cm$^2$ and 235 kW/cm$^2$.

The 2DPC lasers were analysed using a micro-photoluminescence (µPL) setup that enabled optical excitation of a single pixel in the array or a group of pixels by controlling the pump spot size. A pixel with a lattice constant of a=320 nm and a nanowire diameter of d~143 nm was examined to illustrate the lasing threshold behaviour. FIG. 6 shows spectra measured as a function of pump intensity between 5 kW/cm$^2$ and 235 kW/cm$^2$ for this pixel. At low pump intensity, a broad photoluminescence (PL) emission between 400-460 nm is observed. As the pump intensity is increased, a sharp peak emerges at the short wavelength edge of the PL spectrum. Further increase in the pump intensity causes the peak intensity of the narrow feature to rise rapidly in contrast to the slowly rising background PL. The "light-in/light-out" (LL) curves (peak intensity versus pump power density), shown on the left vertical plane in FIG. 6, reveal a clear threshold behaviour. The lasing emission occurs at 415 nm with a threshold of ~130 kW/cm$^2$. In addition to the threshold behaviour, narrow spectral features (<0.2 nm) and interference patterns on the CCD images were observed above threshold. This indicated a high degree of spatial coherence, which is another characteristic of lasing behaviour.

Figure 7:
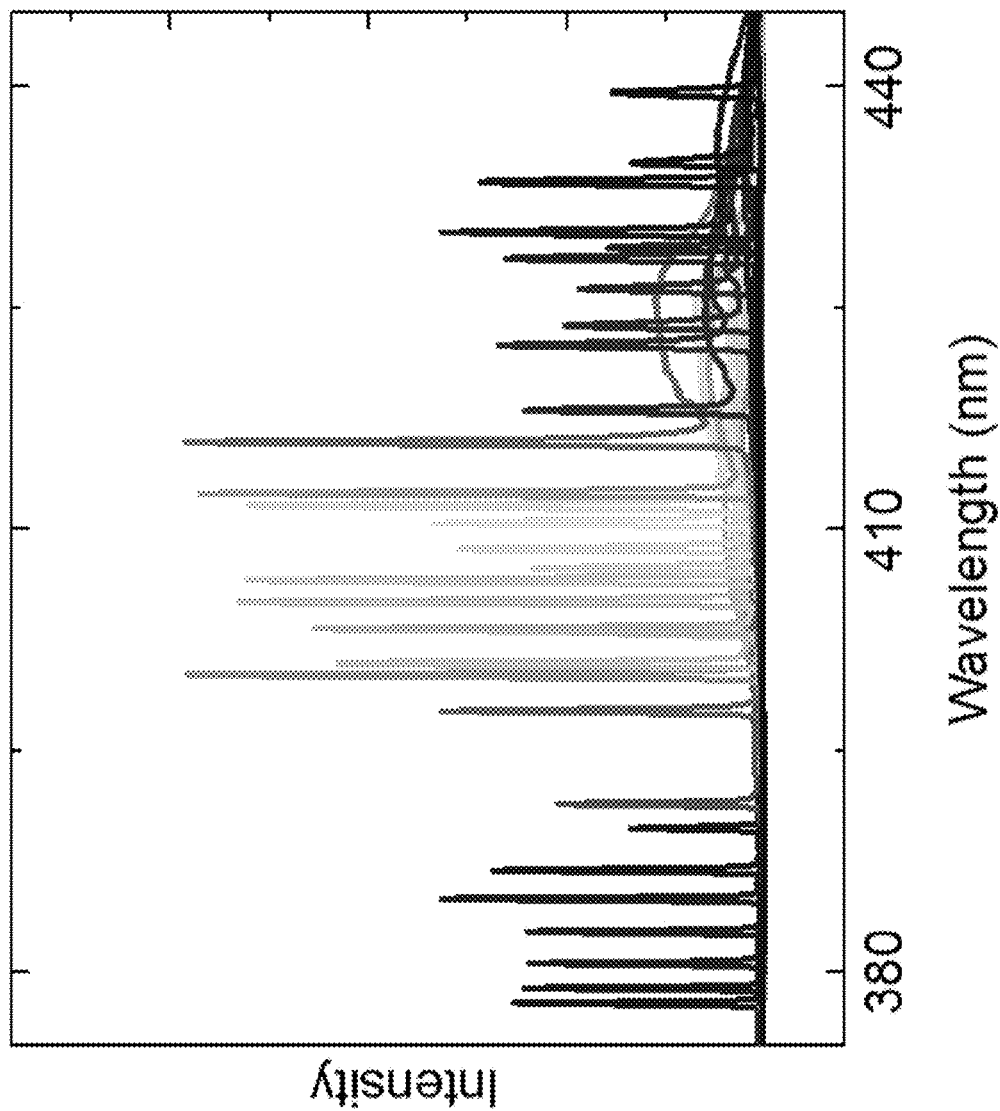
FIG. 7 shows the laser spectra from 30 representative photonic crystal lasers spanning a bandwidth from 380 nm to 440 nm. The area of each laser pixel was 10 μm×10 μm.

All of the pixels exhibited single-mode lasing behavior over a spectral range spanning from 380 nm to 440 nm. The lasing wavelength for all the pixels with different lattice constants corresponded to a reduced frequency (a/λ) of ~0.75 to within 5%. This reduced frequency position corresponds well with the positions of the low dispersion bands shown in FIG. 1(b). In addition to tuning the emission wavelength by changing lattice constants, it is also possible to achieve further fine tuning by changing the nanowire diameters for a given lattice constant. Thus, by suitably adjusting the lattice constant and diameter of the nanowire, a near continuum of lasing wavelengths can be realized within the gain spectral region of the QWs and the underlayer. FIG. 7 shows a representative collection of lasing spectra near threshold from 30 pixels whose wavelengths are between 380-440 nm. Due to the wavelength dependence of the material gain, longer wavelength pixels have a higher pump power requirement to reach threshold, as a result these pixels show a more prominent background PL. By using additional gain sections, a flatter gain profile can be obtained to minimize this effect. A careful observation of the spectra reveals two sets of peaks, one grouped between 375 and 390 nm and the second grouped between 405 and 440 nm. These two regions correspond to the emission band from the underlayer and the InGaN MQWs, respectively.

To confirm that the different gain media sections could be accessed individually through PC design, a control sample was fabricated using the same method but without the quantum well stack, and only GaN and the $In_{0.02}Ga_{0.98}N$ underlayer. Laser emission was found from 378 to 390 nm from this sample indicating that a portion of the broad spectrum of the final device was enhanced by the inclusion of two gain media. The observed laser emission from the under-layer sample can be seen on the left-hand side of FIG. 7. This demonstrates that lasing at different wavelengths can be achieved on a single chip by appropriately designing the 2DPC even on a single epitaxial wafer that is composed of multiple materials with different gain bandwidths. Therefore, by incorporating MQW sections with longer emission wavelengths, the entire visible spectrum can be spanned. This requires high enough quality MQWs to possess the necessary gain required for lasing at longer wavelengths. Larger indium concentration can degrade the quality of the QWs. Unlike conventional lasers with axial cavities, the different gain sections do not interact with each other because of the lateral nature of the feedback provided by the 2DPC.

Figure 8:
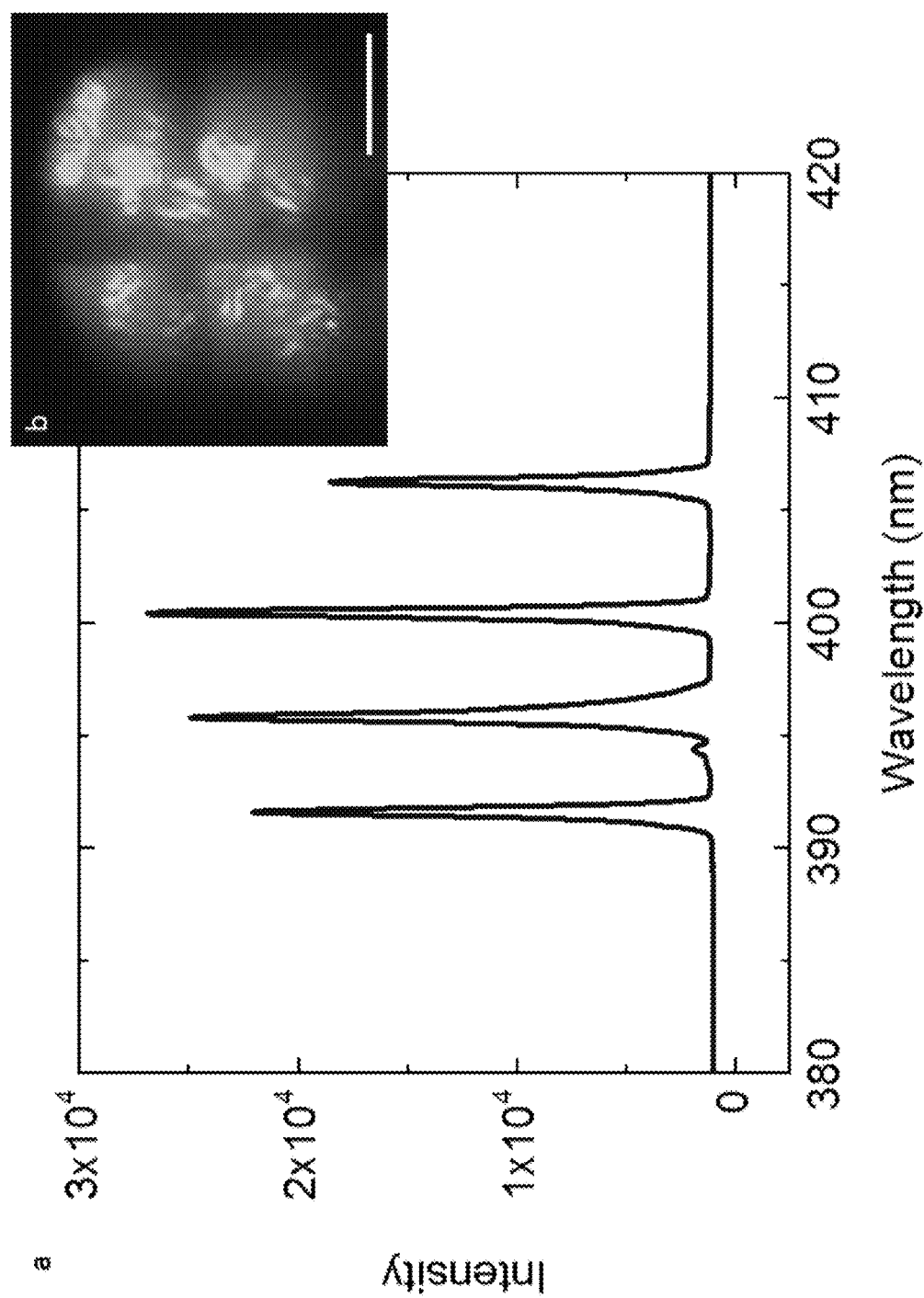
FIG. 8(a) shows the measured spectrum from four photonic crystal laser pixels designed to have slightly different emission wavelengths and operating together in close proximity.
FIG. 8(b) is a photograph of the emission pattern from the four laser pixels.
Figure 9:
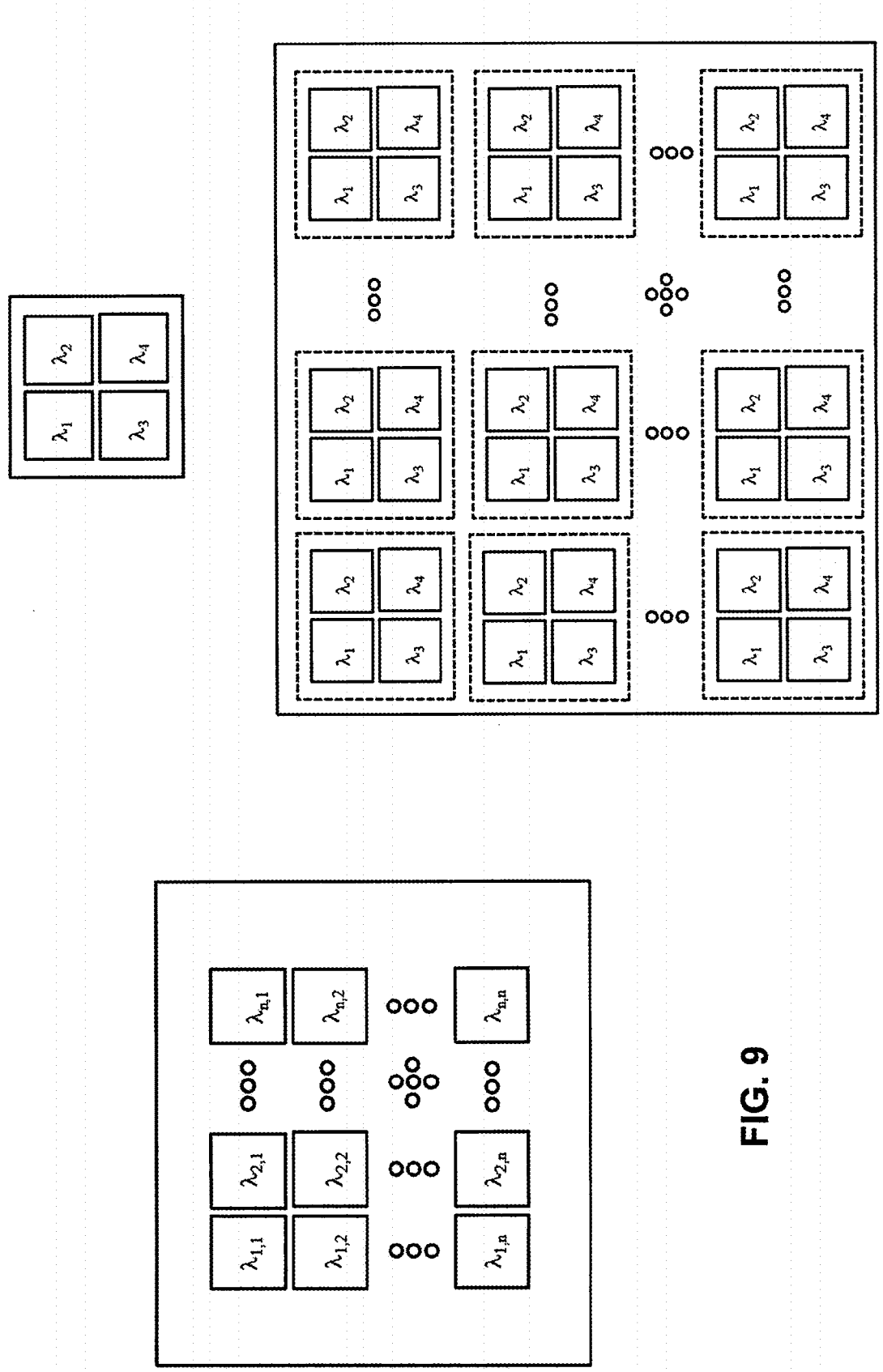
FIG. 9 is a schematic illustration of exemplary photonic crystal laser pixel arrangements.

An additional advantage of this approach is the ability to fabricate densely packed micro-scale laser pixels. By placing the 2DPC lasers in close vicinity to one another a single pump can optically excite multiple pixels at once. FIG. 8(a) shows the results of pumping four of the 2DPC lasers at one time. The spectrum clearly shows four independent laser lines with nearly uniform intensities. These 2DPC lasers were fabricated to have the same lattice constant of 300 nm but slightly different diameters and therefore different emission wavelengths. FIG. 8(b) shows the far field emission pattern of the four lasers operating together. This demonstration shows how III-nitride 2DPC lasers can be used for active wavelength selection in future solid state lighting and display devices. An array of surface emitting laser pixels, each with a different lasing wavelength, can be fabricated from photonic crystal lattices comprised of semiconductor nanowires that can be arranged in desired geometric patterns to form "super-pixels". Arrays can be fabricated by locating, in close proximity, photonic crystal pixels with different emission wavelengths $\lambda_i$ to create arrays that can have arbitrary color by mixing, as shown in FIG. 9. The array can cover a broad spectral range by tuning of the individual photonic crystals in each pixel. The wavelength selection can be achieved by changing the photonic crystal parameters, namely, the lattice constant and the diameter of the individual elements that make up the photonic crystal. The laser pixels in the array can be quite small (on the order of a few microns) to very large (hundreds of microns on each side). The photonic crystals can exhibit nearly arbitrary geometry as long as each pixel lattice contains at least 5 periods for sufficient feedback. The pixels can be spatially very close and have large spectral variation for maximum color gamut. By selectively exciting (optically or electrically) certain laser pixels each with a different emission wavelength, different colours and warmths can be achieved for a breadth of applications. Accordingly, the invention enables wafer-scale laser arrays tuned over the entire UV to visible range.

The present invention has been described as a multicolor photonic crystal laser array. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A surface-emitting photonic crystal laser, comprising a two-dimensional photonic crystal having a periodic vertically emitting laser nanowire structure wherein a gain of an active region of the laser nanowire structure is sufficiently inhomogeneously broadened to emit light at a lasing wavelength within a spectral bandwidth determined by a lattice structure, a lattice constant, and a nanowire diameter and a height of the two-dimensional photonic crystal and wherein the resulting band structure of the two-dimensional photonic crystal is such that the light propagates therein with low group velocity, thereby increasing the interaction time of the light with the active region.

2. The surface-emitting photonic crystal laser of claim 1, wherein the laser nanowire structure comprises at least one additional active region that emits light at another lasing wavelength within the spectral bandwidth.

3. The surface-emitting photonic crystal laser of claim 1, wherein the active region comprises an axial active region.

4. The surface-emitting photonic crystal laser of claim 1, wherein the active region comprises a radial active region.

5. The surface-emitting photonic crystal laser of claim 1, wherein the active region comprises a group III-V heterostructure.

6. The surface-emitting photonic crystal laser of claim 5, wherein the group III-V heterostructure comprises a multiple-quantum-well structure.

7. The surface-emitting photonic crystal laser of claim 5, wherein the group III-V heterostructure comprises a group III-nitride heterostructure.

8. The surface-emitting photonic crystal laser of claim 7, wherein the group III-nitride heterostructure comprises at least two of GaN, AlN, InN, AlGaN, InGaN, InAlN, and AlInGaN.

9. The surface-emitting photonic crystal laser of claim 8, wherein the group III-nitride heterostructure comprises an InGaN/GaN multiple-quantum-well structure.

10. The surface-emitting photonic crystal laser of claim 8, wherein the lasing wavelength is between 200 and 1800 nm.

11. The surface-emitting photonic crystal laser of claim 1, wherein the lattice constant is between 0.7-0.8 times the lasing wavelength.

12. The surface-emitting photonic crystal laser of claim 11, wherein the nanowire diameter is between 0.3 to 0.5 times the lattice constant.

13. The surface-emitting photonic crystal laser of claim 1, wherein the periodic vertically emitting laser nanowire structure comprises a hexagonal lattice structure.

14. The surface-emitting photonic crystal laser of claim 1, wherein the periodic vertically emitting laser nanowire structure comprises a square, rectangular, honeycomb, or Archimedean lattice structure.

15. The surface-emitting photonic crystal laser of claim 1, wherein the periodic vertically emitting laser nanowire structure is optically pumped.

16. The surface-emitting photonic crystal laser of claim 1, wherein the periodic vertically emitting laser nanowire structure is electrically pumped.

17. The surface-emitting photonic crystal laser of claim 1, wherein the periodic vertically emitting laser nanowire structure comprises at least 5 lattice periods, thereby providing a first laser pixel that emits light at a first lasing wavelength.

18. The surface-emitting photonic crystal laser of claim 17, further comprising at least one additional laser pixel that emits light at a different lasing wavelength than the first laser pixel, thereby providing a multicolor photonic crystal laser array.

19. The surface-emitting photonic crystal laser of claim 18, wherein the at least one additional laser pixel comprises a two-dimensional photonic crystal having different lattice structure, lattice constant, and/or nanowire diameter and height than the two-dimensional photonic crystal of the first laser pixel.

20. The surface-emitting photonic crystal laser of claim 18, wherein the emission of light by the surface-emitting photonic crystal laser can be color tuned by selectively exciting the first laser pixel and the at least one additional laser pixels.

* * * * *